United States Patent [19]

Kwon

[11] Patent Number: 5,317,106
[45] Date of Patent: May 31, 1994

[54] COPLANAR CORRECTOR RING

[75] Inventor: Young I. Kwon, San Jose, Calif.

[73] Assignee: VLSI Technology, Inc., San Jose, Calif.

[21] Appl. No.: 785,633

[22] Filed: Oct. 13, 1991

[51] Int. Cl.⁵ .......................................... H01L 23/02
[52] U.S. Cl. ................... 174/52.4; 257/678; 361/728
[58] Field of Search .................. 206/330, 331, 332; 437/211; 361/392, 419, 420, 729, 730; 174/52.2, 52.1, 52.4, 52.3; 257/690, 692, 693, 694, 695, 696, 701, 704, 787, 678

[56] References Cited

U.S. PATENT DOCUMENTS 5,022,869  6/1991  Walker .............................. 439/526
5,026,303  6/1991  Matsuoka et al. ................. 206/331

FOREIGN PATENT DOCUMENTS 3-133784  6/1991  Japan ................................. 206/331

Primary Examiner—Leo P. Picard
Assistant Examiner—Bot Ledinh
Attorney, Agent, or Firm—Patrick T. King

[57] ABSTRACT

A corrector ring maintains the coplanarity of the tips of the leads of a quad flat pack QFP package during shipping and handling. A first snap-fit or adhesively-fixed ring member has an inner peripheral surface which engages the lower walls of the QFP package. The ring member also has an outer peripheral surface which engages the inner surfaces of the resilient leads of the QFP package. A second snap-fit adhesively-fixed ring member is held in place over the outer surfaces of the leads.

11 Claims, 2 Drawing Sheets

COPLANAR CORRECTOR RING

BACKGROUND OF THE INVENTION

1. Field of the Invention

This invention relates to packaging techniques for integrated-circuits and more particularly to techniques for protecting and maintaining the coplanarity of the leads of a flatpack package.

2. Prior Art

As the requirements for the number leads on integrated-circuit packages has increased, the size of the leads has decreased to the point where the leads are small and very fragile. In particular, the quad flat pack (QFP) plastic package has a large number of leads which are very small and fragile. The QFP package is a molded-plastic, flat-profiled, square-shaped package which has thin metal leads extending laterally from all four sides of the body of the molded-plastic package. The leads are bent down and terminate in a foot section, which is inclined slightly downward towards the tip of the lead. The leads are said to have a gullwing configuration, with the tips located at the ends of the wings. A QFP package is assembled to a circuit board by soldering the tips of the leads to a circuit board. A problem with this method of assembly is that it requires all of the tips of the leads to essentially be in the same mounting plane, that is, to be "coplanar." Coplanarity is a problem with the small and fragile gullwing leads of a QFP package because the leads can easily be displaced from coplanarity during shipping, handling, and installation. Because of the possibility of damage in shipping and handling of the QFP packages, customers of integrated-circuit manufacturers are reluctant to specify this type of package. In addition, the damage to the leads of QFP packages needs to be controlled.

During testing, the leads of a QFP package are maintained in proper position by being clamped in a test socket of a test fixture. This technique is expensive and not particularly useful when applied to shipping and handling of large numbers of QFP integrated-circuit packages.

Consequently, the need has arisen for some technique to prevent damage to the leads and to minimize damage to the leads of a QFP package during shipping, handling, and installation.

SUMMARY OF THE INVENTION

It is therefore an object of the invention to provide a relatively inexpensive technique for protecting the leads of a QFP package during shipping, handling, and installation.

In accordance with this and other objects of the invention, a separate corrector ring is applied to a QFP package after the packaged is assembled and end-of-line testing is completed. The corrector ring maintains the coplanarity of the package leads. The corrector ring is held in place by being either snap-on or adhesively-bonded.

In addition, the invention provides a molded protective assembly for the QFP leads instead of depending upon the stability and accuracy of lead bending, trimming, and forming tools.

One embodiment of the invention includes a one-piece unit which is used in connection with preloaded leads. Another embodiment of the invention includes a two piece assembly, which does not require preloaded leads.

The invention maintains the coplanarity of the tips of the leads of a quad flat pack QFP package during shipping and handling. A QFP package is a molded-plastic, flat-profiled, square-shaped package which has thin metal leads extending laterally from near the centerline of the four sides of a body with the leads being bent downwardly to provide a leg portion for the leads. The leads terminate in a foot section which is inclined slightly downwardly toward the tip end of the leads.

One embodiment of the corrector ring includes a first ring member, which has an inner peripheral surface adapted to engage the lower surface of the outer walls of the QFP package. The corrector ring also has an outer peripheral surface which is adapted to engage the inner surfaces of the downwardly extending resilient leg portions of the leads of a QFP package. The first corrector ring is held in position by being snap-fit or adhesively held in place between the lower surface of the outer wall of the QFP package and the inner surface of the downwardly extending resilient leg portions of the leads of the QFP package. The corrector ring member protects and maintains the tips of the leads of the QFP package in proper coplanarity.

In a further embodiment of the invention, the corrector ring arrangement includes a second snap-fit or adhesively-bonded ring member, which has an inner surface adapted to engage the outer surfaces of the downwardly extending resilient leg portions of the leads of the QFP package. The second corrector ring is held in position by being snap-fit or adhesively-bonded in place over the outer surfaces of the downwardly extending resilient leg portions of the leads of the QFP package. The second ring member in cooperation with the first ring member holds the leg portions of the leads in position to maintain the tips of the leads of the QFP package in proper coplanarity.

In another embodiment of the invention, the corrector ring arrangement requires that the lower outer wall portions of the molded body of the QFP package have setback areas. The first snap-fit ring member has an inner peripheral surface which engages with the setback areas of the lower outer wall portions of the molded body of the QFP package.

The invention provides a method of protecting and preserving the coplanarity of the lead tips for the leads of a quad flat pack (QFP) integrated-circuit package during shipping and handling. The first ring member has an inner peripheral surface which engages the lower surface of the outer walls of the QFP package. The first ring member also has an outer peripheral surface adapted to engage the inner surfaces of the downwardly extending resilient leg portions of the leads of the QFP package. The method includes preloading the leads of the QFP package by bending the leads inwardly and snap-fit inserting a first snap-fit ring member over the leads.

The method further includes the step of snap-fitting or adhesively bonding a second ring member over the outer surface of the leads. Where the second ring has an inner surface which engages the outer surfaces of the downwardly extending resilient leg portions of the leads of the QFP package. This methods provides for holding the leg portions of the leads in position with the first and the second snap-fit rings to maintain the tips of the leads of the QFP package in proper coplanarity.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
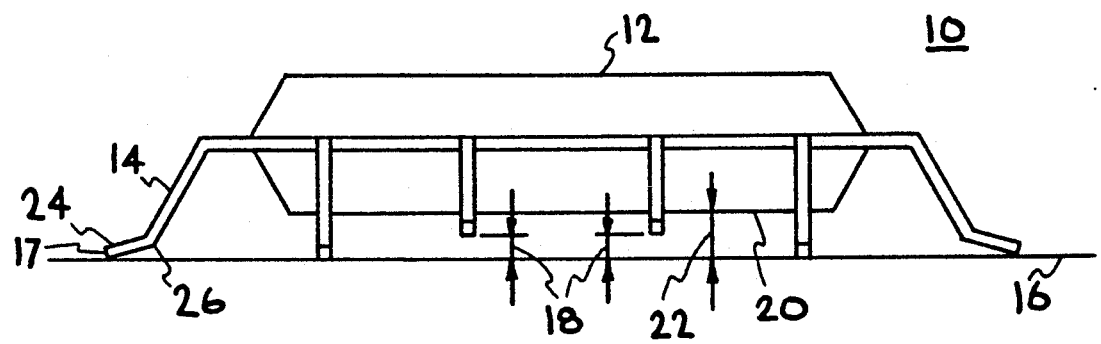
FIG. 1 is an elevation view of a molded-plastic quad flat pack (QFP) package for an integrated circuit.

FIG. 1 shows a conventional molded-plastic quad flat pack (QFP) package 10 for an integrated-circuit die. The QFP package 10 includes a molded-plastic, flat-profiled, square-shaped body 12 containing a thin metal leadframe. The leadframe includes a centrally located die-attach paddle to which a die is attached. The leadframe also includes a pattern of bonding fingers, to each one of which one end of bonding wire is attached. The other end of the bonding wire is attached to a bonding pad on the integrated-circuit die. Each of the bonding fingers of the leadframe is connected to one of a number of thin leads (typically shown as 14), each of which extends laterally from one of the four sides of the body 12 of the molded-plastic package.and each of which terminates in a tip.end 17.

When a package is placed on a flat surface, the package will rest on the at least three leads, which are the lowest leads of the package. The plane 16 defined by these at least three leads is defined as the seating plane of the package of the package. Each lead has a "coplanarity" value, or dimension, (typically shown as 18) relative to the seating plane 16. The at least three leads defining the seating plane have a coplanarity value of zero. All of the other leads are above the plane 16 and have a positive value of coplanarity. The maximum value of coplanarity for the leads is considered to be the coplanarity value of the entire package.

In addition to a value of coplanarity, each package has a value of "standoff" value, or dimension, relative to the planar surface 20 defined by the base, or bottom, plane 20 of the package.body 12. The measured value of the tip of each lead from the base plane 20 is defined as the lead standoff. The standoff value 22 for the entire package is defined as the minimum distance of the base plane 20 from the seating plane 16.

Another measurement of interest is the value of lead foot angle. It is defined as the inclination or declination in degrees of the tip 17 of the foot 24, or lowermost formed section, from the heel 26, or lowermost formed bend of a lead relative to the seating plane 16. Positive values of lead foot angle indicate that the tip 17 is lower than the heel 26.

Values of lead coplanarity and lead foot angle are important because a QFP package is assembled to a circuit board by soldering the tips of the leads to a circuit board. A problem with this method of assembly is that it requires all of the tips of the leads to essentially be in the same mounting plane, that is, to have coplanarity value within certain predefined limits. Coplanarity is a problem with the small and fragile gullwing leads of a QFP package because the leads can easily be displaced from coplanarity during shipping, handling, and installation.

Figure 2:
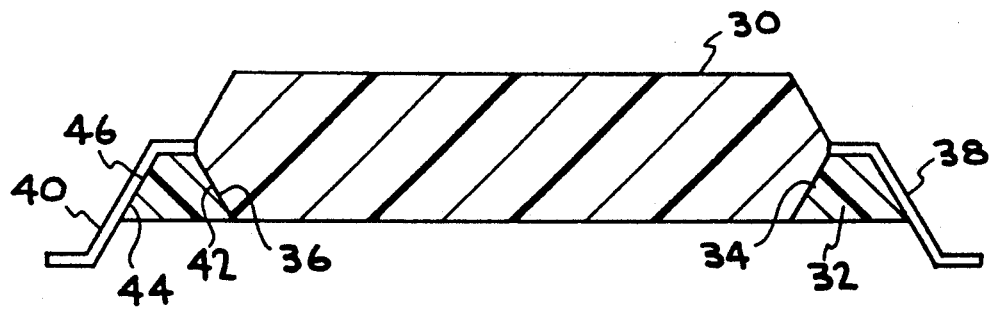
FIG. 2 is a cross-sectional view of a molded plastic quad flat pack (QFP) package with a one-piece corrector ring shown snapped in position beneath the lower sidewalls of the package and the leads of the QFP package.

FIG. 2 is a cross-sectional view of a molded plastic quad flat pack (QFP) package 30 with a first, or lower, corrector ring member 32. The corrector ring member 32 is formed of, for example, of a molded-plastic material. The corrector ring 32 extends around and conforms to the shape of the lower part of the package 30. The corrector ring member 32 is held in position between the lower sidewalls 34,36 of the package 30 and the leads (typically shown as 38,40) of the QFP package.30. The ring member 32 has an inner peripheral surface 42 which is adapted to engage the surface of the lower sidewalls 34,36 of the QFP package 30. The corrector ring member 32 has an outer peripheral surface 44 adapted to engage the inner surfaces 46 of the downwardly extending resilient leg portions of the leads 40 of the QFP package. The leads can be preloaded to assist in holding the corrector ring 32 in place by having the leads be bent slightly inward from their nominal position during the trim-and-form operations on the package subsequent to the package-molding operations. The corrector ring 32 protects the leads and maintains the tips of the leads of the QFP package in proper coplanarity.

The corrector ring 32 is held in position by different techniques. In one technique, the corrector ring is snap-fit in place between the lower surfaces of the outer walls of the QFP package and the inner surfaces of the downwardly extending resilient leg portions of the leads of the QFP package. In another technique, the inner surface 42 of the corrector ring is adhesively bonded to the surfaces of the lower sidewalls 34,36 of the package 30 with a suitable adhesive material.

Figure 3:
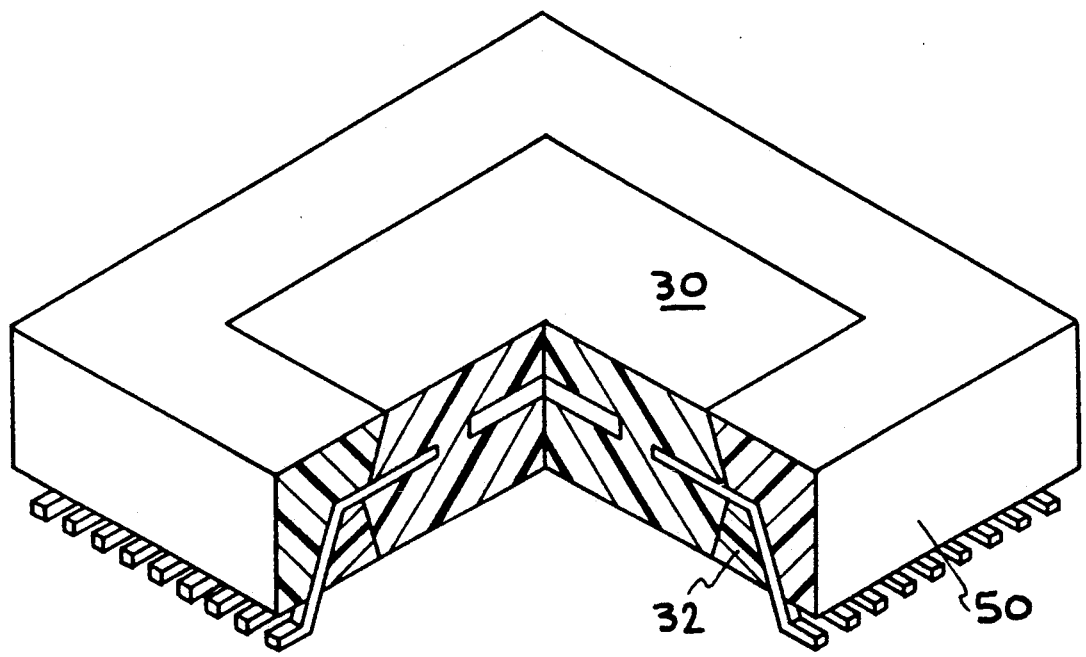
FIG. 3 is an isometric, partially sectional view of a cross-sectional view of a molded plastic quad flat pack (QFP) package with a second corrector ring shown in position above the leads of the QFP package.

FIG. 3 shows the molded plastic quad flat pack (QFP) package 30 with the lower corrector ring 32 in position between the lower surfaces of the outer walls of the QFP package and the inner surfaces of the leads. In addition, a second, or upper, corrector ring member 50 is positioned above the leads of the QFP package 30.

Figure 4:
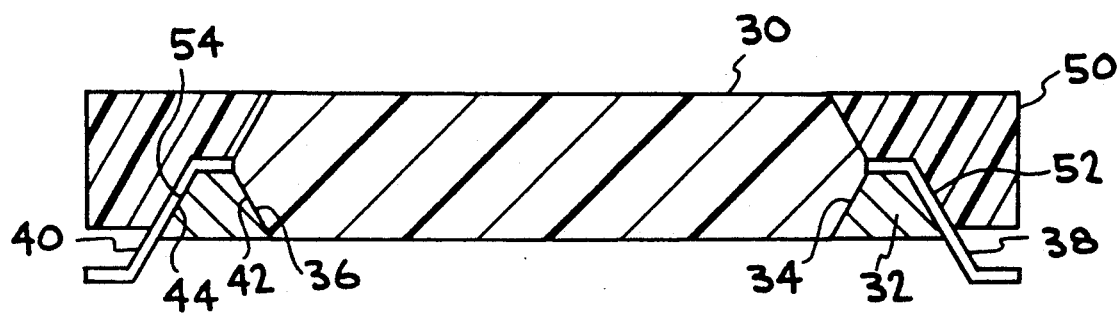
FIG. 4 is a cross-sectional view of FIG. 3 of the molded plastic quad flat pack (QFP) package with the two-piece corrector ring assembly shown in position above and beneath the leads of the QFP package.

FIG. 4 shows the upper corrector ring 50 of FIG. 3. The upper corrector ring 50 is designed to engage the outer surfaces 52, 54 of the resilient leg portions of the leads 38,40 of the QFP package. The second corrector ring 50 is held in position by being snap-fit in place over the outer surfaces of the downwardly extending resilient leg portions of the leads of the QFP package. The second ring member 50, in cooperation with the first ring member 32, holds the leads in position to maintain the tips of the leads of the QFP package in proper coplanarity. Alternatively, the second ring member 50 is held in position by being adhesively bonded to the upper sidewalls of the package 30.

Figure 5:
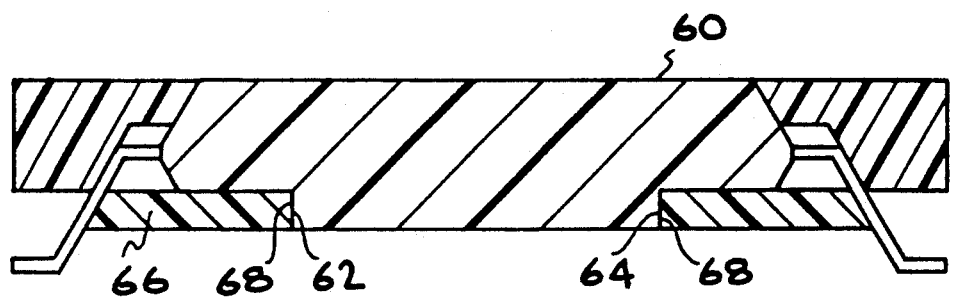
FIG. 5 is a a cross-sectional view of a molded plastic quad flat pack (QFP) package and a second embodiment of two-piece corrector ring assembly.

FIG. 5 shows another embodiment of a two-ring corrector ring assembly. This arrangement requires that the body 60 of a QFP package be molded so that the lower outer wall portions 62,64 of the QFP package be setback beneath the body of the package. A lower corrector ring member 66 has an inner peripheral surface 68 which engages with the setback walls 62,64 areas of the lower outer wall portions of the molded body of the QFP package.

The invention provides a method of protecting and preserving the coplanarity of the lead tips of a quad flat pack (QFP) integrated-circuit package during shipping and handling. The method includes preloading the leads of the QFP package by bending the leads inwardly during the trim and form steps of the package fabrication. A first snap-fit or adhesively-bonded lower ring member, is provided which has an inner peripheral surface adapted to engage the lower surface of the outer walls of the QFP package. The lower ring has an outer peripheral surface adapted to engage the inner surfaces of the downwardly extending resilient leg portions of the leads of the QFP package.

The method further includes the step of fixing a second, or upper, snap-fit ring member over the outer surfaces of the leads. The upper ring has an inner surface adapted to engage the outer surfaces of the downwardly extending resilient leg portions of the leads of the QFP package. This combination of upper and lower ring holds the leg portions of the leads in position to maintain the tips of the leads of the QFP package in proper coplanarity.

Alternatively, the inner peripheral surface of the first ring member engages a setback area of the lower outer wall portions of the molded body of the QFP package. The first snap-fit ring member has an inner peripheral surface which engages with the setback areas of the lower outer wall portions of the molded body of the QFP package.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A corrector ring arrangement for maintaining the coplanarity of the tips of the leads of a quad flat pack QFP package during shipping, handling, and installation, where a QFP package is a molded-plastic, flat-profiled, square-shaped package which has thin metal lead extending laterally from near the centerline of the four sides of a body with the leads being bent downwardly to provide a leg portion for the leads and with the leads terminating in a foot section which is inclined slightly downwardly toward the tip end of the leads, said corrector ring arrangement comprising:

a first ring member, having an inner peripheral surface adapted to engage the lower surface of the outer walls of the QFP package and having an outer peripheral surface adapted to engage the inner surfaces of the downwardly extending resilient leg portions of the leads of the QFP package;

means for holding the first corrector ring in position in place between the lower surface of the outer wall of the QFP package and the inner surface of the downwardly extending resilient leg portions of the leads of the QFP package, wherein said ring member protects and maintains the tips of the leads of the QFP package in proper coplanarity.

2. The corrector ring arrangement of claim 1 wherein the means for holding the first corrector ring in position in place between the lower surface of the outer wall of the QFP package and the inner surface of the downwardly extending resilient leg portions of the leads of the QFP package includes means for snap-fitting the corrector ring in place.

3. The corrector ring arrangement of claim 1 wherein the means for holding the first corrector ring in position in place between the lower surface of the outer wall of the QFP package and the inner surface of the downwardly extending resilient leg portions of the leads of the QFP package includes means for adhesively fixing the corrector ring in place.

4. The corrector ring arrangement of claim 1 including a second ring member having an inner surface adapted to engage the outer surfaces of the downwardly extending resilient leg portions of the leads of the QFP package and including means for holding the second corrector ring in place over the outer surfaces of the downwardly extending resilient leg portions of the leads of the QFP package, wherein the second ring member in cooperation with the first ring member holds the leg portions of the leads in position to maintain the tips of the leads of the QFP package in proper coplanarity.

5. The corrector ring arrangement of claim 4 wherein the means for holding the second corrector ring in place over the outer surfaces of the downwardly extending resilient leg portions of the leads of the QFP package includes means for snap-fitting the second corrector ring in place.

6. The corrector ring arrangement of claim 4 wherein the means for holding the second corrector ring in place over the outer surfaces of the downwardly extending resilient leg portions of the leads of the QFP package includes means for adhesively fixing the second corrector ring in place.

7. The corrector ring arrangement of claim 1 wherein the lower outer wall portions of the molded body of the QFP package have setback areas and wherein the first ring member has an inner peripheral surface which engages with the setback areas of the lower outer wall portions of the molded body of the QFP package.

8. The corrector ring arrangement of claim 1 wherein the ring member is formed of a molded-plastic material.

9. A corrector ring arrangement for maintaining the coplanarity of the tips of the leads of a quad flat pack QFP package during shipping and handling, where a QFP package is a molded-plastic, flat-profiled, square-shaped package which has thin metal leads extending laterally from near the centerline of the four sides of a body with the leads being bent downwardly to provide a leg portion for the leads and with the leads terminating in a foot section which is inclined slightly downwardly toward the tip end of the leads, said corrector ring arrangement comprising:

a first ring member, having an inner peripheral surface adapted to engage the lower surface of the outer walls of the QFP package and having an outer peripheral surface adapted to engage the inner surfaces of the downwardly extending resilient leg portions of the leads of the QFP package;

means for holding the first corrector ring in position in place between the lower surface of the outer wall of the QFP package and the inner surface of the downwardly extending resilient leg portions of the leads of the QFP package, wherein said ring member protects and maintains the tips of the leads of the QFP package in proper coplanarity, said holding means including means for adhesively fixing the corrector ring in place.

10. A corrector ring arrangement for maintaining the coplanarity of the tips of the leads of a quad flat pack QFP package during shipping and handling, where a QFP package is a molded-plastic, flat-profiled, square-shaped package which has thin metal leads extending laterally from near the centerline of the four sides of a body with the leads being bent downwardly to provide a leg portion for the leads and with the leads terminating in a foot section which is inclined slightly downwardly toward the tip end of the leads, said corrector ring arrangement comprising:

a first ring member, having an inner peripheral surface adapted to engage the lower surface of the outer walls of the QFP package and having an outer peripheral surface adapted to engage the inner surfaces of the downwardly extending resilient leg portions of the leads of the QFP package and including means for holding the first corrector ring in position in place between the lower surface of the outer wall of the QFP package and the inner surface of the downwardly extending resilient leg portions of the leads of the QFP package, wherein said ring member protects and maintains the tips of the leads of the QFP package in proper coplanarity;

a second ring member having an inner surface adapted to engage the outer surfaces of the downwardly extending resilient leg portions of the leads of the QFP package and including means for holding the second corrector ring in place over the outer surfaces of the downwardly extending resilient leg portions of the leads of the QFP package, wherein the second ring member in cooperation with the first ring member holds the leg portions of the leads in position to maintain the tips of the leads of the QFP package in proper coplanarity, said holding means including means for adhesively fixing the second corrector ring in place.

11. A corrector ring arrangement for maintaining the coplanarity of the tips of the leads of a quad flat pack QFP package during shipping and handling, where a QFP package is a molded-plastic, flat-profiled, square-shaped package which has thin metal leads extending laterally from near the centerline of the four sides of a body with the leads being bent downwardly to provide a leg portion for the leads and with the leads terminating in a foot section which is inclined slightly downwardly toward the tip end of the leads, said corrector ring arrangement comprising:

a first ring member, having an inner peripheral surface adapted to engage the lower surface of the outer walls of the QFP package and having an outer peripheral surface adapted to engage the inner surfaces of the downwardly extending resilient leg portions of the leads of the QFP package and including means for holding the first corrector ring in position in place between the lower surface of the outer wall of the QFP package and the inner surface of the downwardly extending resilient leg portions of the leads of the QFP package, wherein said ring member protects and maintains the tips of the leads of the QFP package in proper coplanarity;

a second ring member having an inner surface adapted to engage the outer surfaces of the downwardly extending resilient leg portions of the leads of the QFP package and including means for holding the second corrector ring in place over the outer surfaces of the downwardly extending resilient leg portions of the leads of the QFP package, wherein the second ring member in cooperation with the first ring member holds the leg portions of the leads in position to maintain the tips of the leads of the QFP package in proper coplanarity, said holding means including means for snap-fitting the second corrector ring in place.

* * * * *